United States Patent
Ludurczak et al.

(10) Patent No.: US 11,005,002 B2
(45) Date of Patent: May 11, 2021

(54) MANUFACTURING OF A SEMICONDUCTOR PHOTOSENSITIVE DEVICE

(71) Applicant: Commissariat à l'Energie Atomique et aux Energies Alternatives, Paris (FR)

(72) Inventors: Willy Ludurczak, Grenoble (FR); Abdelkader Aliane, Grenoble (FR); Luc Andre, Grenoble (FR); Jean-Louis Ouvrier-Buffet, Grenoble (FR); Julie Widiez, Grenoble (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 16/946,796

(22) Filed: Jul. 7, 2020

(65) Prior Publication Data

US 2021/0013361 A1   Jan. 14, 2021

(30) Foreign Application Priority Data

Jul. 9, 2019 (FR) ...................................... 1907664

(51) Int. Cl.
*H01L 31/18*   (2006.01)
(52) U.S. Cl.
CPC ................................ *H01L 31/1808* (2013.01)
(58) Field of Classification Search
CPC ............. H01L 31/1896; H01L 31/1892; H01L 31/1808; H01L 31/028; H01L 21/3003
See application file for complete search history.

(56) References Cited

U.S. PATENT DOCUMENTS

| 6,833,195 | B1* | 12/2004 | Lei | H01L 21/76254 257/E21.318 |
| 2006/0021565 | A1* | 2/2006 | Zahler | H01L 31/03046 117/89 |
| 2009/0061557 | A1* | 3/2009 | Akiyama | H01L 21/76254 438/94 |
| 2009/0194153 | A1* | 8/2009 | Hilali | H01L 31/1836 136/255 |
| 2009/0194162 | A1* | 8/2009 | Sivaram | H01L 31/0747 136/258 |
| 2009/0197368 | A1* | 8/2009 | Sivaram | H01L 31/0747 438/73 |
| 2010/0129948 | A1* | 5/2010 | Isaka | H01L 21/76254 438/57 |
| 2010/0317145 | A1* | 12/2010 | Clark | H01L 31/1892 438/96 |
| 2010/0330731 | A1* | 12/2010 | Agarwal | H01L 31/03762 438/73 |

(Continued)

OTHER PUBLICATIONS

Preliminary Search Report for French Application No. 1907664 dated Feb. 21, 2020, 2 pages.

(Continued)

*Primary Examiner* — Earl N Taylor
(74) *Attorney, Agent, or Firm* — Moreno IP Law LLC

(57) ABSTRACT

The present disclosure relates to a method of manufacturing a semiconductor device, including the successive steps of: a) forming doped germanium on a germanium layer covering a first support; b) covering said doped germanium with a second support; and c) removing the first support.

14 Claims, 6 Drawing Sheets

(56) References Cited

U.S. PATENT DOCUMENTS

| | | | |
|---|---|---|---|
| 2017/0025454 A1* | 1/2017 | Cheng | H01L 31/02005 |
| 2019/0140133 A1* | 5/2019 | Chen | H01L 31/028 |
| 2020/0365464 A1* | 11/2020 | Sreenivasan | H01L 29/42392 |

OTHER PUBLICATIONS

Reyoud, V., et al., "Germanium based photonic components toward a full silicon/germanium photonic platform," Progress in Crystal Growth and Characterization of Materials, No. 63 (2017), pp. 1-24.

Depuydt, B., et al., "Germanium: From the first application of Czochralski crystal growth to large diameter dislocation-free wafers," Materials Science in Semiconductor Processing, No. 9 (2006), pp. 437-443.

Hartmann, J.M., et al., "Epitaxial growth of Ge thick layers on nominal and 6○ off Si(0 0 1); Ge surface passivation by Si," Semicond. Sci. Technol., No. 24 (2009), 10 pages.

Attolini, G., et al., "Homo and hetero epitaxy of Germanium using isobutylgermane," Thin Solid Films, No. 517 (2008), pp. 404-406.

Klatt, J., et al., "Boron-controlled solid phase epitaxy of germanium on silicon: A new nonsegregating surfactant," Appl. Phys. Lett., No. 64 (1994), pp. 360-362.

Deguet, C., et al., "Fabrication and characterisation of 200mm germanium-on-insulator (GeOI) substrates made from bulk germanium," Electronics Letters, vol. 42, No. 7 (2006), 2 pages.

Jutzi, M., et al., "Ge-on-Si Pin-Photodiodes for Vertical and In-Plane Detection of 1300 to 1580 nm Light," Proceedings of the 30th European Solid-State Circuits Conference (2004), pp. 345-348.

\* cited by examiner

MANUFACTURING OF A SEMICONDUCTOR PHOTOSENSITIVE DEVICE

FIELD

The present disclosure generally relates to semiconductor devices, and in particular to a photosensitive device made up of germanium.

BACKGROUND

Photosensitive devices made up of germanium are used in applications of detection of infrared radiations for example having wavelengths in the range from approximately 0.9 µm to approximately 1.6 µm. Such a device for example comprises a photodiode, that is, a diode conducting a current when it receives an infrared radiation.

Photosensitive devices are often arranged in an array, for example, in an image sensor. Each photosensitive device receives the radiation originating from a portion of a scene. The array then enables to obtain an infrared image of the scene. Each pixel of the image corresponds to one of the photosensitive devices of the array.

SUMMARY

There is a need to improve known semiconductor-based devices and their manufacturing methods.

There is a need to decrease the parasitic current, called dark current, flowing through a photosensitive device in the absence of a received radiation.

There is a need to decrease differences in operating characteristics, such as the dark current and/or the detection sensitivity, between photosensitive devices provided to be identical, for example, arranged in an array.

There is a need to improve the manufacturing efficiency and the reliability of photosensitive devices.

An embodiment overcomes all or part of the disadvantages of known semiconductor-based devices.

An embodiment overcomes all or part of the disadvantages of known methods of manufacturing semiconductor-based devices.

An embodiment provides a method of manufacturing a photosensitive device having a decreased dark current.

An embodiment provides a method of manufacturing photosensitive devices having decreased differences between their operating characteristics.

An embodiment provides a manufacturing method which is more reliable than known methods and providing photosensitive devices which are more reliable than known devices.

An embodiment provides a method of manufacturing a semiconductor device, comprising the successive steps of: a) forming, by implantation of hydrogen ions, a buried hydrogenated layer in a germanium substrate under a portion of the substrate forming a germanium layer; b) covering the substrate with a first support; c) removing the buried layer and the portion of the substrate located on the side of the buried layer opposite to the first support, while leaving in place, covering the first support, said germanium layer; d) forming doped germanium on said germanium layer; e) covering said doped germanium with a second support; and f) removing the first support, the method further comprising, before step d), an epitaxy of intrinsic germanium on said germanium layer.

According to an embodiment, the first support and/or the second support is a silicon wafer.

According to an embodiment, the germanium of said substrate is intrinsic and monocrystalline.

According to an embodiment, the intrinsic germanium epitaxy step is implemented after step c).

According to an embodiment, at step c), an insulator is located between the substrate and the first support, said insulator being removed after step e).

According to an embodiment, at step d), said doped germanium is formed by epitaxy.

According to an embodiment, said germanium layer is intrinsic.

According to an embodiment, said germanium layer is monocrystalline and preferably has less than 10 defects per square centimeter.

According to an embodiment, said germanium layer has a thickness greater than or equal to approximately 1 µm.

According to an embodiment, at step e), an insulating layer is located between said doped germanium and the second support, said insulating layer preferably comprising silicon oxide.

According to an embodiment, the method comprises, at step e), the steps of: covering said doped germanium with a first portion of said insulating layer; covering the second support with a second portion of said insulating layer; and performing a molecular bonding between the first and second portions of said insulating layer.

According to an embodiment, the method comprises, after step f), an epitaxy, on said germanium layer, of doped germanium of a conductivity type different from that of the doped germanium formed at step d).

According to an embodiment, at step f), the first support is removed by ion etching and/or by polishing.

According to an embodiment, said device is a photodiode.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, various steps of forming and/or of removal of various insulating, semiconductor, or metallic regions or layers, such as epitaxy, etching, polishing, thermal treatment, etc. steps, are not described in detail, the described embodiments being compatible with usual steps of forming and/or removal of insulating, semiconductor, or metallic regions or layers.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
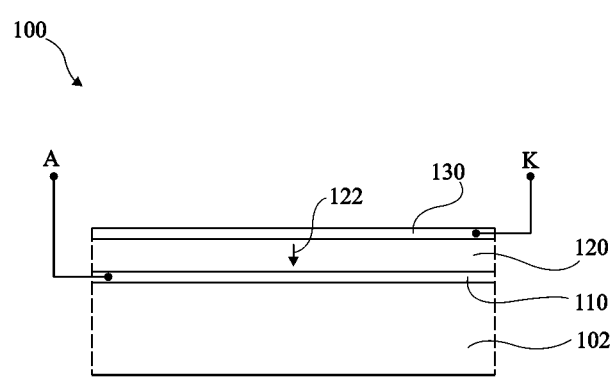
FIG. 1 is a partial simplified cross-section view of an example of a device to which the described embodiments apply.

FIG. 1 is a partial simplified cross-section view of an example of a device to which the described embodiments apply. More particularly, in the present example, the device is a germanium-based photodiode 100.

As an example, photodiode 100 is located on a support 102. Support 102 is typically plate-shaped. Support 102 is preferably a semiconductor wafer portion, and support 102 more preferably has its upper surface covered with an insulator (not shown).

Photodiode 100 is of PIN type, that is, it comprises an intrinsic semiconductor region between doped semiconductor regions of opposite types. A semiconductor is here called "intrinsic" when it is not intentionally doped or when its doping level is smaller than $10^{16}$ atoms per cm$^3$, preferably smaller than $10^{15}$ atoms per cm$^3$. Photodiode 100 comprises a stack, in the following order from support 102, of a P-type doped germanium layer 110, of an intrinsic germanium layer 120, and of an N-type doped germanium layer 130.

Layers 110 and 130 are respectively connected to anode contacting area A of the photodiode and to cathode contacting area K of the photodiode. As a variant, layers 110 and 130 have their conductivity types N and P exchanged, and contacting areas A and K are exchanged.

In operation, the photodiode is reverse-biased. An infrared radiation received by the photodiode causes a current 122 which flows in the photodiode of N-type doped layer 130 towards P-type doped layer 110 through intrinsic layer 120. In other words, PIN photodiode 100 is of vertical type, that is, current 122 flows from one to the other of the main surfaces (upper and lower) of intrinsic layer 120. An advantage of a vertical photodiode is that, for a same sensitivity, it occupies less space than a photodiode where the intrinsic region and the doped regions are not stacked. This for example enables, for a same sensitivity and a same dimension of image sensors, to increase the number of pixels of the obtained infrared image.

In certain applications, the photodiode is reverse-biased during the radiation detection. More particularly, the reverse voltage is sufficient to obtain an avalanche effect when an infrared radiation is received by the photodiode. Advantageously, this avalanche effect results in an increased sensitivity with respect to a photodiode which does not use the avalanche effect.

Embodiments described in the following drawings provide, with respect to known vertical PIN photodiodes, increasing the crystal quality of intrinsic layer 120. In other words, in such embodiments, intrinsic layer 120 is preferably monocrystalline and has, across at least a portion of its thickness, a particularly low number or an absence of defects such as dislocations. This enables to decrease the dark current of the photodiode.

Further, when photodiodes designed to be identical are manufactured, differences between the operating characteristics of the obtained photodiodes are obtained in practice. The fact of decreasing the number of defects of the crystal lattice of intrinsic layer 120, for example, to a value smaller than 10 defects per cm$^2$, enables to decrease the differences in operating characteristics due to the differences between the positions and numbers of defects.

Further, a decrease in the number of defects of the crystal lattice of intrinsic layer 120 enables to decrease the risk for the photodiode not to have the desired operating characteristics, and to be for example rejected during a test after manufacturing. The manufacturing efficiency of the photodiodes is thus improved. Further, the risk for the photodiode to degrade is decreased and the reliability of the photodiode is thus improved.

FIGS. 2 to 11 are partial simplified cross-section views showing successive steps of an embodiment of a method of manufacturing a semiconductor-based device. More particularly, the device is, as an example, a photodiode of the type described in relation with FIG. 1.

Figure 2:
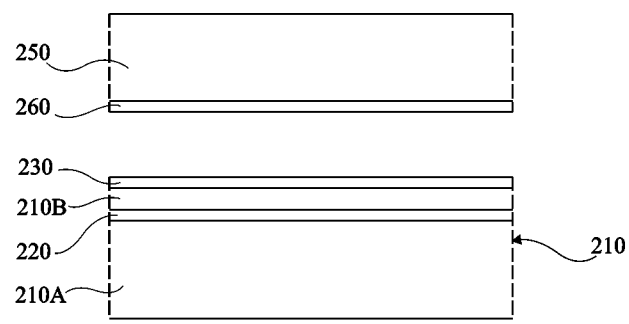
FIG. 2 is a partial simplified cross-section view showing a step of an embodiment of a method of manufacturing a semiconductor-based device.
Figure 3:
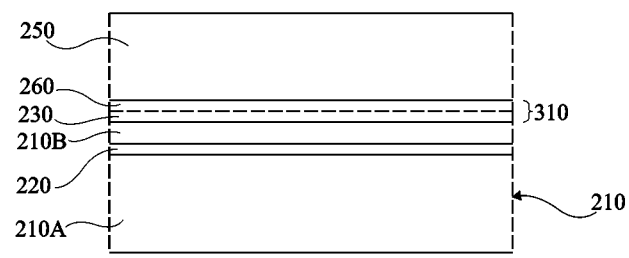
FIG. 3 is a partial simplified cross-section view showing another step of the method.
Figure 4:
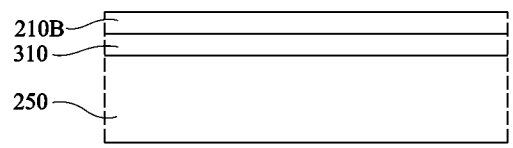
FIG. 4 is a partial simplified cross-section view showing another step of the method.

At the steps of FIGS. 2 to 4, a germanium layer 210B covering a support 250 is formed. More particularly, in the example of these steps, layer 210B is a portion of a substrate 210 and is formed and installed on support 250 by a method of the type known under trade name "Smart Cut".

At the step of FIG. 2, a germanium substrate 210 is provided. Substrate 210 preferably has the shape of a plate, for example, substrate 210 is a germanium wafer.

More preferably, the crystal lattice of substrate 210 exhibits no defect, or next to no defect, that is, a number of defects smaller than 10 per cm$^2$, preferably smaller than 5 per cm$^2$. To achieve this, the substrate may be obtained by a Czochralzski method.

Hydrogen ions are implanted from the upper surface (in FIG. 2) of substrate 210 to form a hydrogenated buried layer 220 in substrate 210. Buried layer 220 is located under germanium layer 201B. The rest of substrate 210 corresponds to a portion 201A located under buried layer 220. As a result of this step, layer 210B is preferably intrinsic and monocrystalline, and has no defect, or next to no defect. Layer 210B is intended to form all or part of the intrinsic layer 120 (FIG. 1) of the future photodiode.

The depth of buried layer 220 is linked to the energy of the implanted ions. This depth is greater than the thickness of germanium layer 210B. Germanium layer 201B for example has a thickness greater than 0.1 μm, more preferably greater than 0.2 μm, more preferably still greater than 0.5 μm. Preferably, the implantation is provided so that the thickness of germanium layer 210B is a large as possible, that is, typically greater than or equal to approximately 1 μm. Thereby, germanium layer 210B may advantageously form all or the most part of the intrinsic layer 120 of the future photodiode. This will enable, in the future photodiode, to maximize the above-mentioned advantages due to the crystal quality of intrinsic layer 120.

Preferably, an electrically insulating or dielectric layer 230 is formed on germanium layer 210B. Insulating layer 230 is more preferably formed after the hydrogen ion implantation. Insulating layer 230 may be made of silicon oxide.

In parallel, before or after the forming of the structure comprising portion 210A and layers 220, 210B, and 230, support 250 is provided. Support 250 is typically plate-shaped, with two opposite main surfaces (lower and upper in FIG. 2). Support 250 is temporary, that is, it is intended to be removed at a subsequent step (step of FIG. 9). Preferably, support 250 is a semiconductor wafer, for example, made of silicon. As a variant, any other support adapted to a method of the type known under trade name "Smart Cut" and capable of being removed at a subsequent step may be used.

Preferably, an electrically-insulating layer 260 is formed on the lower surface of support 250. More preferably, the material of insulating layer 260 is the same as that of insulating layer 230.

At the step of FIG. 3, germanium layer 210B is covered with support 250. Preferably, for this purpose, insulating layers 230 and 260 are assembled by the placing into contact of their surfaces which have remained accessible, that is, non-covered. Preferably, the assembly is of molecular bonding type, obtained after the polishing of the surfaces intended to be in contact with each other, the placing of the layers into contact, and the application of a pressure. Layers 230 and 260 then form an insulator 310 between germanium layer 210B and support 250. The described embodiments are not limited to an assembly by molecular bonding and are compatible with any current steps enabling to cover a germanium layer with a support, for example, by assembly and/or forming of the support on the germanium layer.

At the step of FIG. 4, buried layer 220 and the portion 210A of substrate 210 are removed, to leave in place germanium layer 210B. The structure of FIG. 4 is shown as turned over with respect to that of FIG. 3, the elements covering in FIG. 4 the upper surface of support 250 being located in FIG. 3 on the lower surface of support 250. To remove buried layer 220 and portion 210A, a thermal treatment is performed to cause the rupture of buried layer 220, followed by a polishing of the upper surface of the structure shown in FIG. 4.

In the described embodiments, the steps of FIGS. 2 to 4 may be replaced with any steps enabling to obtain a germanium layer on a support, the germanium layer being preferably intrinsic and monocrystalline, and more preferably still with no or next to no defect of the crystal lattice. The support may be any support capable of being removed at a subsequent step. For example, the steps of FIGS. 2 to 4 are replaced with the sole provision of a substrate such as substrate 210, the germanium layer corresponding to a surface portion of the substrate, and the rest of the substrate corresponding to a support. The obtained structure corresponds to that of FIG. 4, where the support is made of germanium, and insulator 310 is omitted. However, as compared with such an example, the presence of insulator 310 eases the subsequent removal of the support. The germanium layer may also for example be obtained by epitaxy on a doped germanium layer intended to form doped layer 110 or 130 (FIG. 1). However, as compared with a germanium epitaxy, the fact of providing for germanium layer 210B to be a portion of a substrate eases the obtaining of the defect-free or almost defect-free monocrystalline state of germanium layer 210B.

Figure 5:
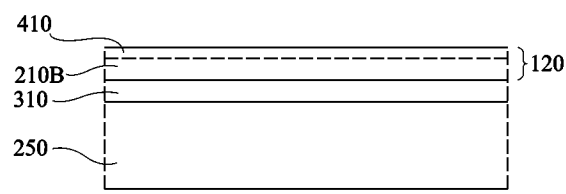
FIG. 5 is a partial simplified cross-section view showing another step of the method.

At the step of FIG. 5, an intrinsic germanium layer 410 is grown by epitaxy on the surface of germanium layer 210B made accessible at the step of FIG. 4 (upper surface). Layers 210B and 410 form the intrinsic layer 120 of the future photodiode. For this purpose, the thickness of epitaxial layer 410 is selected so that the sum of the thicknesses of layers 210B and 410 corresponds to the desired thickness of intrinsic layer 120, for example, the desired thickness is greater than or equal to approximately 1.5 μm. The thickness of epitaxial layer 410 is for example in the range from 20% to 50% of that of germanium layer 210B. As a variant, the step of FIG. 5 is omitted, and the intrinsic layer 120 of the future photodiode is formed of germanium layer 210B. However, as compared with such a variant, the provision of layer 410 enables to ease the obtaining of the desired thickness of layer 120.

Although the step of FIG. 5 preferably takes place after the step of FIG. 4 (removal of portion 210A of substrate 210), it may, as a variant, be provided to form layer 410 at the step of FIG. 2 on the germanium layer 210B intended to be left in place on support 250 at the step of FIG. 4, before the forming of insulating layer 230. After the step of FIG. 4, layer 410 is then located under germanium layer 210B. However, as compared with such a variant, the fact for the step of FIG. 5 to take place after that of FIG. 4 enables to avoid the risk for the thermal budget of the epitaxy to cause, due to the presence of hydrogenated buried layer 220, a separation between portion 210A and germanium layer 210B.

Figure 6:
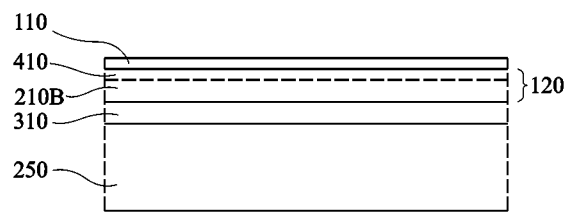
FIG. 6 is a partial simplified cross-section view showing another step of the method.

At the step of FIG. 6, doped germanium is formed on the structure obtained at the step of FIG. 5, the doped germanium forming the layer 110 of the future photodiode, as described in relation with FIG. 1. In other words, the doped germanium covers germanium layers 410 and 210B, and is preferably in contact with layer 410. If the step of FIG. 5 is omitted, the doped germanium covers germanium layer 210B, and is preferably in contact with germanium layer 210B.

Preferably, doped germanium layer 110 is formed by epitaxy. As compared with other ways of forming layer 110, this enables to more accurately control the thickness of layer 110 and its doping profile, in particular the doping profile at the junction between intrinsic layer 120 and the doped germanium of layer 110. This enables to improve the operating characteristics of the photodiode and to limit differences in operating characteristics between photodiodes provided to be identical.

Figure 7:
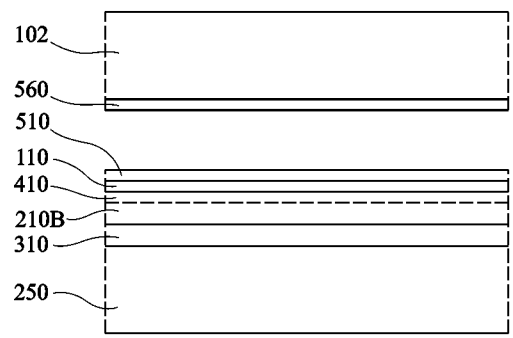
FIG. 7 is a partial simplified cross-section view showing another step of the method.

At the step of FIG. 7, an electrically insulating or dielectric layer 510 is formed on doped germanium layer 110. Insulating layer 510 may be made of silicon oxide.

A support such as the support 102 described in relation with FIG. 1, preferably formed of a silicon wafer, is further provided.

Preferably, an electrically insulating layer 560 is formed on the lower surface of support 102, for example, made of silicon oxide. More preferably, the material of insulating layer 510 is the same as that of insulating layer 560.

Figure 8:
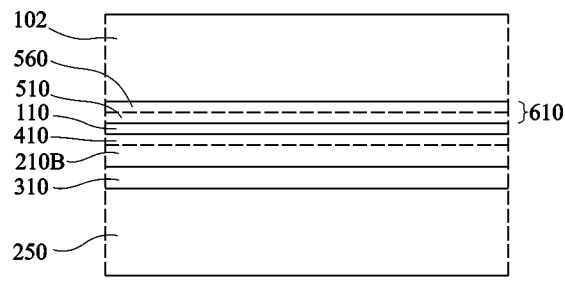
FIG. 8 is a partial simplified cross-section view showing another step of the method.

At the step of FIG. 8, doped germanium layer 110 is covered with support 102. Preferably, for this purpose, layers 510 and 560 are assembled by placing into contact of their surfaces which have remained accessible. Preferably, the assembly is of molecular bonding type. Layers 510 and 560 then form an insulating layer 610 between doped germanium layer 410 and support 102, layers 510 and 560 respectively forming first and second portions of layer 610. As a variant, layer 610 may be omitted. However, the fact of providing layer 610 advantageously enables to obtain an electric insulation in the future photodiode between support 102 and doped germanium layer 110. Further, the fact of providing layers 510 and 560 enables to ease the molecular bonding with respect to an assembly where these layers would be omitted. The described embodiments are not limited to an assembly by molecular bonding and are compatible with the current steps enabling to cover a doped germanium layer with a support, for example, by assembly and/or forming of the support on the doped germanium layer.

Figure 9:
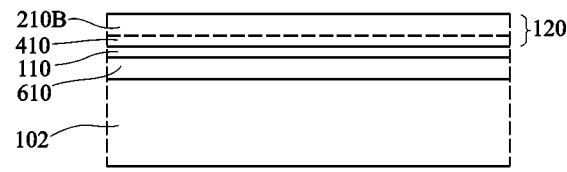
FIG. 9 is a partial simplified cross-section view showing another step of the method.

At the step of FIG. 9, support 250 is removed. Preferably, insulator 310 is also removed, to make germanium layer 210B accessible. The structure of FIG. 9 is shown as turned over with respect to that of FIG. 8, the elements covering in FIG. 9 the upper surface of support 102 being located in FIG. 8 on the lower surface of support 102. Preferably, support 250 and insulator 310 are removed by ion etching and/or by polishing.

Thus, in the structure obtained at the step of FIG. 9, doped germanium layer 110 is located between support 102 and germanium layer 120. In other words, doped germanium layer 110 is buried under upper germanium layer 120.

It could have been devised to obtain a doped germanium layer buried under an upper germanium layer by ion implantation of dopants through the upper germanium layer. For example, it could have been devised to obtain a buried doped germanium layer from a germanium layer 210B such as that of FIG. 4, by doping a lower portion of layer 210B through an upper portion of this layer. However, the obtained upper germanium layer would have had a thickness smaller than that of layer 210B.

As a comparison with the forming of a buried layer by ion implantation, the steps of FIGS. 5 to 9 enable, from a structure such as that of FIG. 4, to increase the thickness of the upper germanium layer. Further, the steps of FIGS. 5 to 9 enable to more easily control the doping profile of the buried layer. Further, the steps of FIGS. 5 to 9 enable to avoid the ion implantation through the upper germanium layer, which enables to avoid any risk of modifying this layer during the implantation. In particular, in the preferred case where layer 210B is made of intrinsic monocrystalline germanium with no defect or next to no defect at the end of the steps of FIGS. 2 to 4, layer 210B remains made of monocrystalline germanium with no defect or next to no defect at the end of the step of FIG. 9.

The steps of FIGS. 2 to 9 thus enable, in particular, for the obtained germanium layer 210B to be made of monocrystalline germanium with no defect or next to no defect. More particularly, the intrinsic germanium layer 120 of the photodiode is monocrystalline with no defect or next to no defect across a portion at least of its thickness corresponding to layer 210B. As mentioned, this provides the advantages of decreasing the dark current, of decreasing differences between photodiodes provided to be identical, and of increasing the reliability and the manufacturing efficiency. The thicker germanium layer 210B, the more these advantages are reinforced.

Although the steps of FIGS. 2 to 9 have been described in the specific case of the manufacturing of a photodiode, they may be implemented to manufacture any semiconductor-based device of the type comprising, on a support, a doped germanium layer, such as layer 110, topped with a germanium region, preferably intrinsic and/or monocrystalline, preferably with no or next to no defects. In particular, the above-mentioned advantages of steps 5 to 9 are kept for any device of this type.

Figure 10:
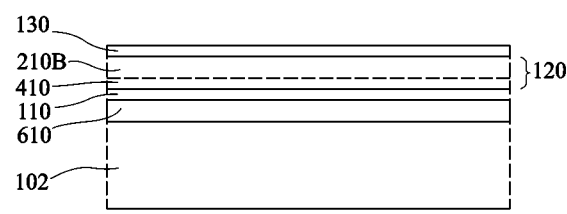
FIG. 10 is a partial simplified cross-section view showing another step of the method.

At the step of FIG. 10, an N-type doped layer 130 is formed. The P and N conductivity types of doped germanium layers 110 and 130 may be exchanged. Thus, layers 110 and 130 have opposite conductivity types. The N-type doped layer is preferably epitaxial, which enables to easily control its thickness and its doping profile.

Figure 11:
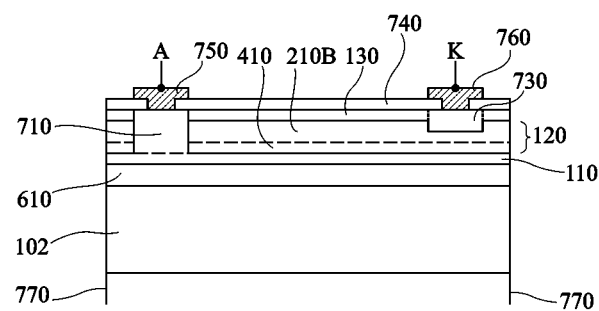
FIG. 11 is a simplified cross-section view showing another step of the method.

At the step of FIG. 11, a P-type doped region 710 extending from the upper surface of N-type doped layer 130 to P-type doped layer 110, through N-type layer 130 and intrinsic layer 120, is formed by ion implantation. An N-type doped region 730 separated from P region 710 and extending from the upper surface of N-type layer 130, through at least a portion of N-type layer 130, preferably all the way to a level located in intrinsic layer 120, is formed by ion implantation. An insulating layer 740, for example, made of silicon oxide, is then formed on N-type layer 130 and, preferably, in contact with N-type layer 130. Insulating layer 740 has through openings on P-type region 710 and N-type region 730. These openings are filled with metal regions 750 and 760 in contact with respective P doped region 710 and N doped region 730. The doping levels of doped P region 710 and N doped region 730 are preferably higher than those of the respective P layer 110 and N layer 130, so that these regions form with respective metal regions 750 and 760 respective anode and cathode contacting areas A and K of the photodiode.

As an example, a plurality of photodiodes has been simultaneously formed on support 102. Support 102 and layers 610, 110, 120, and 130 are then cut into individual photodiodes by cutting lines 770.

Figure 12:
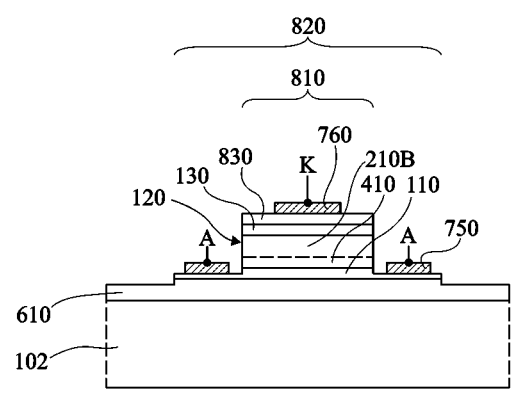
FIG. 12 is a simplified cross-section view showing a variant of the step of FIG. 11.

FIG. 12 is a simplified cross-section view showing a variant of the step of FIG. 11. This variant is compatible with a diode such as described in M. Jutzi et al.'s article, entitled "Ge-on-Si Pin-Photodiodes for Vertical and In-Plane detection of 1300 to 1580 nm Light" and published in "ESSCIRC 2004—Proceedings of the 34th European Solid-State Device Research Conference", pp. 345-347.

The structure obtained at the step of FIG. 10 is covered with a layer 830 in contact with upper N-type layer 130. Layer 830 is for example made of N-type doped silicon.

All the portions of layers 830, 130, 120, 110 located outside of a location 820 are removed. Such a removal is for example performed by etching from the upper surface of layer 830 down to at least the upper surface of insulating layer 610.

All the remaining portions of layers 830, 130, and 120 located outside of a location 810 strictly included in location 820 are removed. More particularly, location 820 extends on either side of location 810. Such a removal is for example performed by etching from the upper surface of layer 830 down to at least the upper surface of P-type doped germanium layer 110. Portions of layer 110 on either side of location 820 have thus been made accessible.

Metal regions 750 of anode A, for example, made of aluminum, are then formed on top of and in contact with the accessible portions of layer 110. A metal region 760 of cathode K is formed on top of and in contact with the remaining portions of layer 830.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of manufacturing a semiconductor device, comprising the successive steps of:
   a) forming, by implantation of hydrogen ions, a hydrogenated buried layer in a germanium substrate under a portion of the substrate forming a germanium layer;
   b) covering the substrate with a first support;
   c) removing the buried layer and the portion of the substrate located on the side of the buried layer opposite to the first support, while leaving in place, covering the first support, said germanium layer;
   d) forming doped germanium on said germanium layer;
   e) covering said doped germanium with a second support; and
   f) removing the first support, the method further comprising, before step d), an epitaxy of intrinsic germanium on said germanium layer.

2. The method according to claim 1, wherein the first support and/or the second support is a silicon wafer.

3. The method according to claim 1, wherein the germanium of said substrate is intrinsic and monocrystalline.

4. The method according to claim 1, wherein the step of epitaxy of intrinsic germanium is implemented after step c).

5. The method according to claim 1, wherein, at step c), an insulator is located between the substrate and the first support, said insulator being removed after step e).

6. The method according to claim 1, wherein, at step d), said doped germanium is formed by epitaxy.

7. The method according to claim 1, wherein said germanium layer is intrinsic.

8. The method according to claim 1, wherein said germanium layer is monocrystalline and preferably has less than 10 defects per square centimeter.

9. The method according to claim 1, wherein said germanium layer has a thickness greater than or equal to 1 µm.

10. The method according to claim 1, wherein, at step e), an insulating layer is located between said doped germanium and the second support, said insulating layer preferably comprising silicon oxide.

11. The method according to claim 10, comprising, at step e), the steps of:
    covering said doped germanium with a first portion of said insulating layer;
    covering the second support with a second portion of said insulating layer; and
    performing a molecular bonding between the first and second portions of said insulating layer.

12. The method according to claim 1, comprising, after step f), an epitaxy, on said germanium layer, of doped germanium of a conductivity type different from that of the doped germanium formed at step d).

13. The method according to claim 1, wherein, at step f), the first support is removed by ion etching and/or by polishing.

14. The method according to claim 1, wherein said device is a photodiode.

* * * * *